US011735993B2

(12) United States Patent
Bryant

(10) Patent No.: US 11,735,993 B2
(45) Date of Patent: Aug. 22, 2023

(54) ANALYZING AN OPERATING CONDITION OF A POWER CONVERTER

(71) Applicant: Maschinenfabrik Reinhausen GmbH, Regensburg (DE)

(72) Inventor: Angus Bryant, Cambridge (GB)

(73) Assignee: MASCHINENFABRIK REINHAUSEN GMBH, Regensburg (DE)

(*) Notice: Subject to any disclaimer, the term of this patent is extended or adjusted under 35 U.S.C. 154(b) by 261 days.

(21) Appl. No.: 17/276,877

(22) PCT Filed: Sep. 19, 2019

(86) PCT No.: PCT/EP2019/075228
§ 371 (c)(1),
(2) Date: Mar. 17, 2021

(87) PCT Pub. No.: WO2020/058436
PCT Pub. Date: Mar. 26, 2020

(65) Prior Publication Data
US 2022/0037993 A1 Feb. 3, 2022

(30) Foreign Application Priority Data

Sep. 21, 2018 (EP) .................................... 18196074

(51) Int. Cl.
*H02M 1/00* (2006.01)
*H02M 1/32* (2007.01)
(Continued)

(52) U.S. Cl.
CPC ............... *H02M 1/00* (2013.01); *G01K 7/01* (2013.01); *G01R 31/42* (2013.01); *H02M 1/327* (2021.05); *H02M 3/156* (2013.01)

(58) Field of Classification Search
None
See application file for complete search history.

(56) References Cited

U.S. PATENT DOCUMENTS 7,336,470 B2 *  2/2008  Satoh ........................ H01F 7/18
                                                361/166
7,764,054 B1 *  7/2010  Guo ....................... H02M 3/156
                                                323/283
(Continued)

FOREIGN PATENT DOCUMENTS

DE          19613735 A1    10/1997
EP          2498391 A1     9/2012
(Continued)

*Primary Examiner* — Jeffrey A Gblende
(74) *Attorney, Agent, or Firm* — Leydig, Voit & Mayer, Ltd.

(57) ABSTRACT

A method analyzes an operating condition of a power converter. The method includes: providing a sample clock signal; determining repeatedly at least one operating parameter of a power semiconductor device of the power converter; and determining the operating condition of the power converter depending on the at least one determined operating parameter. The repetitions of the determining the at least one operating parameter are synchronous to the sample clock signal. For a given repetition of the determination of the at least one operating parameter, determining the at least one operating parameter includes measuring the at least one operating parameter or identifying a value for the at least one operating parameter from a previous repetition depending on a switching behavior of the power converter within the given repetition.

17 Claims, 2 Drawing Sheets

(51) Int. Cl.
  *G01K 7/01*   (2006.01)
  *G01R 31/42*  (2006.01)
  *H02M 3/156*  (2006.01)

(56) References Cited

U.S. PATENT DOCUMENTS

| | | |
|---|---|---|
| 9,035,633 B1 | 5/2015 | Naiknaware et al. |
| 9,035,640 B2 * | 5/2015 | Deng .................. H02M 3/1582 |
| | | 323/285 |
| 9,553,513 B2 * | 1/2017 | Xu ........................ H02M 3/156 |
| 10,033,272 B2 * | 7/2018 | Rader ................... H02M 3/156 |
| 10,644,581 B2 * | 5/2020 | El Markhi .......... H02M 3/1563 |

FOREIGN PATENT DOCUMENTS

| | | |
|---|---|---|
| EP | 2657712 A2 | 10/2013 |
| EP | 3373019 A1 | 9/2018 |

* cited by examiner

ANALYZING AN OPERATING CONDITION OF A POWER CONVERTER

CROSS-REFERENCE TO PRIOR APPLICATIONS

This application is a U.S. National Phase Application under 35 U.S.C. § 371 of International Application No. PCT/EP2019/075228, filed on Sep. 19, 2019, and claims benefit to European Patent Application No. EP 18196074.1, filed on Sep. 21, 2018. The International Application was published in English on Mar. 26, 2020 as WO 2020/058436 under PCT Article 21(2).

FIELD

The present invention relates to a method and a circuit for analyzing an operating condition of a power converter.

BACKGROUND

Performing measurements in power converters to analyze an operating condition may be disturbed if the measurements coincide with switching events of the power converter. A power converter usually comprises a base clock that is used for example for deriving a pulse-width modulation, PWM, switching pattern. This may for example be a carrier, in particular a triangular carrier, used for generating a PWM square wave to control device switching of the power converter.

Existing approaches have assumed that the measurements are synchronized to the base clock. In particular, peaks of the triangular carrier signal may provide guaranteed periods where no switching takes place.

However, if an apparatus used for the analysis of the operating condition is not implemented within the power converter module, for example if it is implemented as a stand-alone hardware, the carrier signal of the power converter is not accessible for the apparatus and therefore cannot be used for synchronizing the measurements. The PWM square wave is not suitable for synchronizing the measurements either, since is typically has irregular edges.

Furthermore, even if a synchronization to the operation of the power converter would be possible, such synchronization may be problematic since the power converter may work at switching frequencies being either too low or too high for a feasible condition analysis. For example, too low frequencies affect the achievable resolution of the analysis while too high frequencies may lead to an unreasonable computational effort.

SUMMARY

An embodiment of the present invention provides a method that analyzes an operating condition of a power converter. The method includes: providing a sample clock signal; determining repeatedly at least one operating parameter of a power semiconductor device of the power converter; and determining the operating condition of the power converter depending on the at least one determined operating parameter. The repetitions of the determining the at least one operating parameter are synchronous to the sample clock signal. For a given repetition of the determination of the at least one operating parameter, determining the at least one operating parameter includes measuring the at least one operating parameter or identifying a value for the at least one operating parameter from a previous repetition depending on a switching behavior of the power converter within the given repetition.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
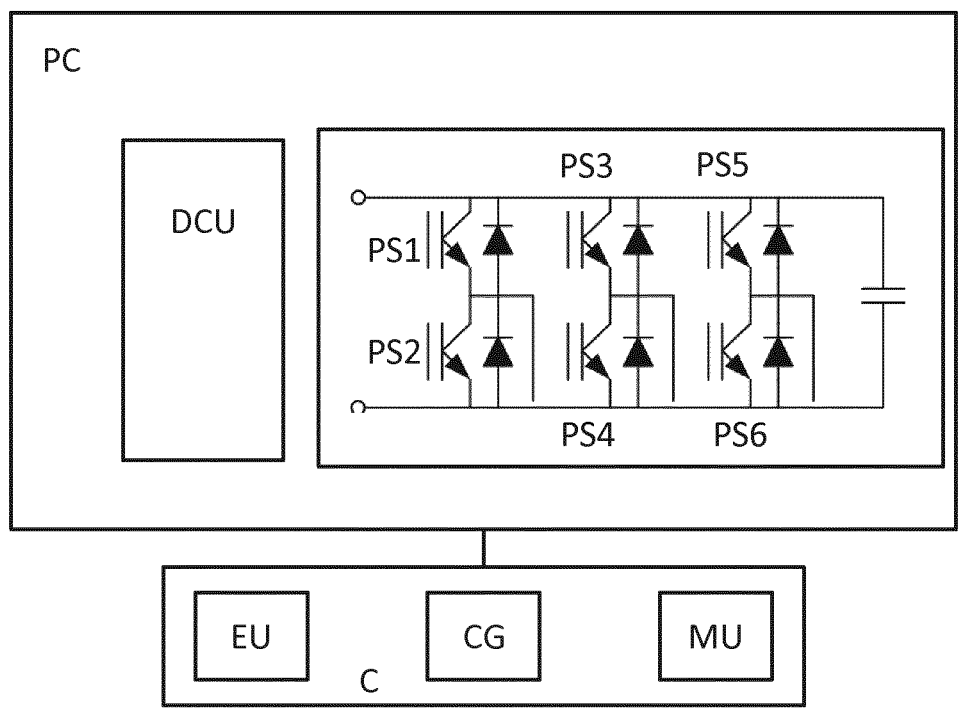
FIG. 1 shows a block diagram of a power converter and an exemplary embodiment of a circuit according to an embodiment of an improved concept of the present invention.

Embodiments of the present invention provide an improved concept for analyzing an operating condition of a power converter being applicable to a greater variety of power converters.

The improved concept of the present invention is based on the idea to provide a dedicated sample clock signal that is independent from an operation of the power converter and synchronize measurements of an operating parameter of the power converter to the sample clock signal. Depending on a switching behavior within a measurement interval, the operating parameter is measured or taken from a preceding measurement interval. Then, the operating condition is determined depending on the measured operating parameter.

According to the improved concept of the present invention, a method for analyzing an operating condition of a power converter is provided. The method comprises providing a sample clock signal with a constant sample frequency. Therein, the sample clock signal is in particular asynchronous to and independent of an operation, in particular an operation frequency, of the power converter. At least one operating parameter of a power semiconductor device of the power converter is determined repeatedly, wherein the repetitions are synchronous to the sample clock signal. Depending on a switching behavior of the power converter within a given repetition, determining the at least one operating parameter in the given repetition comprises measuring the at least one operating parameter during the given repetition or identifying a value for the at least one operating parameter from a previous repetition, in particular from a repetition preceding, in particular directly preceding, the given repetition. The operating condition of the power converter is determined depending on the at least one determined operating parameter.

Depending on the switching behavior of the power converter within a further given repetition, at least one of the operating parameters may not be determined for the further given repetition.

In case the at least one operating parameter determined in the given repetition comprises more than one parameter, one or more of the at least one operating parameter may be measured and one or more other of the at least one operating parameter may be identified or taken from the preceding repetition.

The repetitions being synchronous to the sample clock signal means that at least one of the operating parameters of a power semiconductor device of the power converter is determined repeatedly during or at the end of each of a plurality of consecutive sample intervals with a duration defined by the frequency of the sample clock signal, in particular by an inverse of the frequency of the sample clock signal.

By means of a method according to the improved concept of the present invention, the analysis of the operating condition may be performed asynchronously to the operation of the power converter, in particular to a base clock signal of the power converter or a PWM carrier signal of the converter. Hence, the switching frequency of the power converter does not influence the applicability of the method, neither does a specific hardware architecture of the power converter or a system for performing the method. Therefore, analyzing the operating condition of the power converter according to the improved method may be performed universally, that is without significant restrictions to a great variety of power converters, in particular to most power converters. In particular, the method allows retro-fitting of power converters by implementing a system to perform the method according to the improved concept as a stand-alone hardware that may be connected to the power converter via standard ports.

According to several implementations of the method, determining the operating condition comprises determining at least one value for a power loss of the power semiconductor device depending on the at least one determined operating parameter. The operating condition is then determined depending on the at least one value for the power loss.

According to several implementations, during each repetition, there are zero switching events, corresponding to a static on- or off-state, or there is exactly one switching event, that is one turn-on or turn-off event, or there are exactly two switching events, that is one turn-on and one turn-off event, or there are more than two switching events. Determining the operating parameters depends on which of the listed cases is present in the respective repetition.

According to several implementations, determining the operating condition comprises determining a junction temperature of the power semiconductor device, in particular the operating condition corresponds to the junction temperature.

According to several implementations, the at least one value for the power loss includes a conduction power loss and/or a switching power loss of the power semiconductor device.

The conduction power loss for a sample interval may for example be calculated according to the expression:

$$P_c = V_{on} * I_{on} * t_{on}/T_s, \quad (1)$$

wherein $P_c$ is the conduction power loss, $V_{on}$ is an on-state, that is forward, voltage of the power semiconductor device, $I_{on}$ is an on-state current of the power semiconductor device, $t_{on}$ is a total on-state duration of the power semiconductor device within the considered sample interval and $T_s$ is the duration of the sample interval.

The switching power loss for a sample interval may for example be calculated according to the expression:

$$P_{sw} = (N_{on} * E_{on} + N_{off} * E_{off})/T_s, \quad (2)$$

Therein, $P_{sw}$ is the switching power loss, $N_{on}$ is a total number of turn-on events within the sample interval, $N_{off}$ is a total number of turn-off events within the sample interval, $E_{on}$ and $E_{off}$ are a turn-on energy and a turn-off energy, respectively. The turn-on and turn-off energy each depend on the on-state current $I_{on}$, the off-state voltage $V_{off}$ and/or a junction temperature of the power semiconductor device. The turn-on energy and the turn-off energy may for example be obtained from look-up tables. For example, the look-up tables may be predetermined and be retrieved from previously estimated junction temperatures.

According to several implementations, determining the operating condition of the power semiconductor device includes feeding a thermal model of the power converter with data depending on the at least one determined operating parameter and simulating the junction temperature according to the thermal model.

According to several implementations, determining the operating condition comprises feeding the at least one value for the power loss as an input to the thermal model for the power converter and determining the operation condition, in particular the junction temperature, depending on an output of the thermal model.

Therein, the conduction power loss and/or the switching power loss and/or a sum of the conduction and the switching power loss may be fed to the thermal model. The sum of the conduction and switching power loss represents a self-heating power loss due to self-heating of the power semiconductor device.

According to several implementations, a cross-coupling power loss is determined and fed to the thermal model as a further input. The cross-coupling power loss is due to a further device or several further devices of the power converter, which may affect the junction temperature of the power semiconductor device.

According to several implementations, the at least one value for the power loss is determined during or at the end of each of a plurality of consecutive sample intervals, except for such sample intervals showing a static off-state throughout the whole sample interval.

According to several implementations, the at least one operating parameter includes the total number of turn-on events within the respective sample interval and/or the total number of turn-off events within the respective sample interval and/or a total on-state duration within the respective sample interval.

According to several implementations, the at least one operating parameter includes an on-state condition of the power semiconductor device, in particular the on-state voltage or the on-state current during the respective sample interval.

According to several implementations, in sample intervals with more than one on-state periods, wherein the on-state voltage or the on-state current is measured, the on-state voltage or the on-state current is measured for only one of the on-state periods. Alternatively, it may be measured for more than one of the on-state periods and a corresponding average value may be used for further analysis. Alternatively, instead of the average value another type of aggregate value may be used, for example a median value.

According to several implementations, the at least one operating parameter includes an off-state condition of the power semiconductor device, in particular the off-state voltage during the respective sample interval.

According to several implementations, in sample intervals with more than one off-state periods, wherein the off-state is measured, the off-state voltage is measured for only one of the off-state periods. Alternatively, it may be measured for more than one of the off-state periods and a corresponding average or other aggregate value may be used for further analysis.

According to several implementations, the sample clock signal being asynchronous to the operation of the converter includes the sample clock signal being asynchronous to a base clock signal of the converter. In particular, a frequency of the base clock signal differs from a frequency of the sample clock signal and/or a phase of the base clock signal is shifted with respect to a phase of the sample clock signal.

According to several implementations, the power converter is configured to utilize a switching scheme, in particular a PWM scheme, for power conversion. The sample clock signal being asynchronous to the operation of the converter includes the sample clock signal being asynchronous to a characteristic signal, in particular a carrier signal, of the switching scheme.

According to several implementations, the carrier signal has a triangular waveform or a sawtooth waveform or a ramp waveform.

According to several implementations, a period, that is an inverse of the frequency, of the sample signal is choses as a compromise between a processing speed and a thermal time constant of the system.

According to several implementations, the period of the sample clock signal lies between 0.2 ms and 2 ms, in particular between 0.8 ms and 1.2 ms, for example the frequency is 1 ms or 1.0 ms.

According to several implementations, the power semiconductor device comprises a MOSFET or an IGBT. Determining the at least one operating parameter includes measuring gate voltage of the MOSFET or IGBT, in particular a gate-emitter voltage of the IGBT, during a turn-off event of the MOSFET or IGBT. The gate voltage is in particular given by a gate voltage just before the turn-off event.

According to several implementations, determining the operating condition of the power converter includes determining the junction temperature depending on the on-state voltage and the gate voltage.

According to several implementations, determining the operating condition of the power converter includes determining a switching frequency, in particular of the power semiconductor device. The switching frequency may for example be determined depending on the total number of turn-on events and the total number of turn-off events.

According to several implementations, determining the operating condition of the power converter includes determining a duty ratio, in particular of the power semiconductor device. The duty ratio may for example be determined from the total on-state duration and the duration of the sample interval.

According to several implementations, determining the operating condition of the power converter includes determining a DC link or DC supply voltage of the power semiconductor device. The DC link or the DC supply voltage may be determined from the off-state voltage, in particular be equal to the off-state voltage.

According to several implementations, determining the operating condition of the power converter includes determining a characteristic AC quantity of the power semiconductor device, for example an AC frequency, an AC current, an AC voltage and/or a power factor. The power factor is given by a phase shift angle between the AC current and the AC voltage or by a cosine of the phase shift angle. The AC voltage and AC current may for example given by respective root means square values. The AC frequency may include a fundamental AC frequency and/or a higher-order harmonic AC frequency.

According to several implementations, determining the characteristic AC quantity includes a fast Fourier transform, FFT.

According to the improved concept, also a circuit for analyzing an operating condition of a power converter is provided. In particular, the circuit is configured to perform a method according to the improved concept.

The circuit comprises a clock generator, a measuring unit and an evaluation unit. The clock generator is configured to provide a sample clock signal with a constant sample frequency, wherein the sample clock signal is in particular asynchronous to an operation of the power converter. The measuring unit is configured to determine repeatedly at least one operating parameter of a power semiconductor device of the power converter. Therein, the repetitions are synchronous to the sample clock signal. For a given repetition, determining the at least one operating parameter comprises measuring the at least one operating parameter or identifying a value for the at least one operating parameter from a previous repetition depending on a switching behavior of the power converter within the given repetition. The evaluation unit is configured to determine the operating condition of the power converter based on the at least one determined operating parameter.

According to some implementations, the power semiconductor device comprises a diode, in particular a PIN diode or a Schottky diode or a thyristor or a field effect transistor, for example a MOSFET, a HEMT or a JFET, or a bipolar transistor, for example an IGBT or a BJT.

Further implementations and embodiments of the circuit according to the improved concept follow readily from each of the various implementations and embodiments of the method according to the improved concept and vice versa.

In the following, the invention is explained in detail with respect to exemplary implementations by reference to the drawings.

FIG. 1 shows a block diagram of a power converter PC and an exemplary embodiment of a circuit C according to an improved concept of the present invention. Without any restrictions to the circuit C, the power converter may for example comprise a plurality of power semiconductor devices PS1, PS2, ..., PS6 (six are shown as exemplary number only; circuit symbols of an IGBT are used only as a placeholder for any power semiconductor device) and a drive and control unit DCU. In the example of FIG. 1, the devices PS1, ..., PS6 are depicted as part of a six-switch three-phase two-level inverter which is a standard application for a power converter. However, this is done only for illustration, no restriction is imposed by this example, since the improved concept does not rely on such structure. The Power converter PC further may comprise circuitry for generating a switching signal SS, for example a PWM signal. The PWM signal may be generated based on a PWM carrier signal. The carrier signal or the switching signal SS may be generated based on a base clock signal or system clock signal generated for example by a base clock generator of the power converter PC.

The circuit C is, for example, arranged outside of the power converter PC and coupled to the power converter PC. The circuit C comprises an evaluation unit EU and a measuring unit MU. Furthermore, the circuit comprises a clock generator CG. Optionally, the circuit C may comprise a storage unit.

Figure 2:
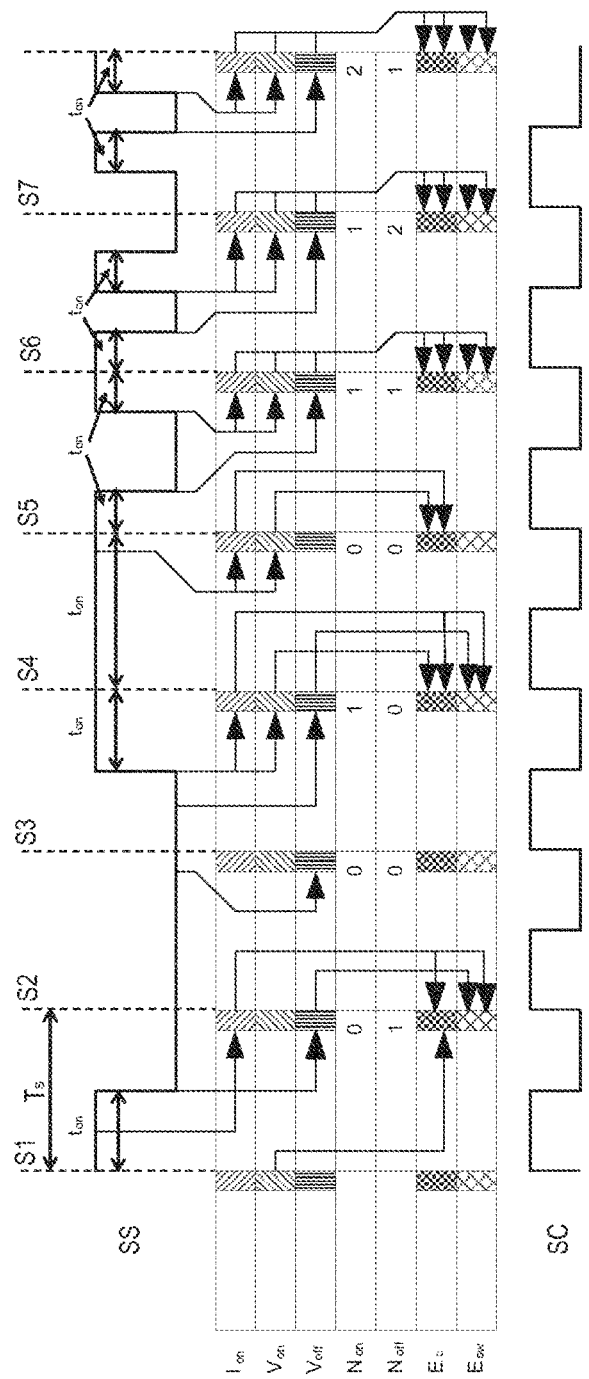
FIG. 2 shows a diagram depicting schematically an exemplary implementation of a method according to an improved concept of the present invention.

The operation of the circuit C is explained with respect to an exemplary implementation of a method according to the improved concept as depicted in FIG. 2.

The clock generator CG provides a sample clock signal SC with a constant sample frequency. In FIG. 2, seven consecutive sample intervals S1, S2, ..., S7 with equal duration corresponding for example to the inverted sample frequency. In particular, the sample clock signal SC may be asynchronous to or independent of an operation of the power converter PC, for example of the base clock signal or the switching signal SS.

The measuring unit MU is configured to determine operating parameters of one of the power semiconductor devices PS1, ..., PS6, for example of the device PS1, during each of the sample intervals S1, ..., S7. In the shown example, the operating parameters include an on-state voltage $V_{on}$, an on-state current $I_{on}$ and an off-state voltage $V_{off}$ of the device PS1.

Furthermore, the operating parameters may include a total number of turn-on events $N_{on}$ and a total number of turn-off events $N_{off}$ within a sample interval. A turn-on event is a switching event from logic zero to logic one of the switching signal SS, while a turn-off event is a switching event from logic one to logic zero of the switching signal SS. Thus, in the shown example, there are two turn-on events during sample interval S7 and there is one respective turn-on event during each of sample intervals S3, S5, S6. During sample intervals S1, S2, S4, there are no turn-on events. Further, there are two turn-off events in sample interval S6 and there is one respective turn-off event in each of sample intervals S1, S5, S7. During sample intervals S2, S3, S4, there are no turn-off events.

Depending on a switching behavior of the power converter PC, in particular on the switching signal SS, within a certain sample interval S1, ..., S7, some of the operating parameters may be measured during or at the end of the sample interval or may be taken from a preceding sample interval. This is described in the following exemplarily with respect to FIG. 2.

In the first sample interval S1, the switching signal SS begins with an on-state and has one turn-off event. Since the on-state current $I_{on}$ is stable after a very short time period after the turn-on event, $I_{on}$ is measured during interval S1. Alternatively, the on-state current $I_{on}$ may be taken from a previous sample interval. Compared to the current, the on-state voltage $V_{on}$ requires a longer time period after the turn-on event. Therefore, for example, the on-state voltage $V_{on}$, is not measured during S1 but taken from the previous sample interval. Note that the on-state voltage $V_{on}$ could also be measured during S1 if the width of the respective on-state pulse is sufficiently large. The turn-off voltage $V_{off}$ is measured during S1, for example at or directly after the turn-off event. However, this is not a restriction and the off-state voltage $V_{off}$ could as well be measured at a later instant in interval S1. Based on the parameters determined in this way, the evaluation unit EU may calculate a conduction energy $E_c = V_{on} * I_{on} * t_{on}$. From this, the conduction power loss $P_c$ is obtained according to equation (1) above, that is $P_c = E_c / T_s$, wherein $T_s$ is the duration of each of the sample intervals S1, ..., S7. Furthermore, the evaluation unit EU may calculate a switching energy $E_{sw} = N_{on} * E_{on} + N_{off} * E_{off}$, wherein $E_{on}$ and $E_{off}$ may be functions of the on-state current $I_{on}$, the off-state voltage $V_{off}$ and a junction temperature of the power semiconductor device PS1. Corresponding values for $E_{on}$ and $E_{off}$ may for example be retrieved from respective look-up tables. Then, the switching power loss $P_{sw}$ is given by equation (2) above, that is $P_{sw} = E_{sw}/T_s$.

In the second sample interval S2, the switching signal SS begins with an off-state and has no turn-on event. Therefore, the switching and conduction energies $E_{sw}$, $E_c$ are both zero. The on-state current and voltage $I_{on}$, $V_{on}$ cannot be determined for interval S2 by definition. The off-state voltage $V_{off}$, however, may optionally be measured.

In the third sample interval S3, the switching signal SS begins with an off-state and has one turn-on event. In this case, all three of the on-state current and voltage $I_{on}$, $V_{on}$ and the off-state voltage $V_{off}$ may be measured during S3. Alternatively, the off-state voltage $V_{off}$ may be taken for example from interval S2. The switching and conduction energies $E_{sw}$, $E_c$ may be determined as described above. Alternatively, the on-state voltage $V_{on}$ may be taken for example from interval S1. This may be advantageous in case the on-state duration within S3 after the turn-on event in S3 is too short for the on-state voltage $V_{on}$ to settle.

In the fourth sample interval S4, the switching signal SS begins with an on-state and has no turn-off event. Therefore, the off-state voltage $V_{off}$ cannot be determined for interval S4 by definition and the switching energy $E_{sw}$ is zero. The on-state current and voltage $I_{on}$, $V_{on}$ may be measured during S4 and the conduction energy $E_c$ may be determined as described above.

In the fifth sample interval S5, the switching signal SS begins with an on-state and has one turn-off event followed by one turn-on event. Therefore, all three of the on-state current and voltage $I_{on}$, $V_{on}$ and the off-state voltage $V_{off}$ may be measured during S5. The switching and conduction energies $E_{sw}$, $E_c$ may be determined as described above. Alternatively, the on-state voltage $V_{on}$ may be taken for example from interval S4. This may be advantageous in case the on-state duration within S5 after the second turn-on event in S5 is too short for the on-state voltage $V_{on}$ to settle.

In the sixth sample interval S6, the switching signal SS begins with an on-state and has a turn-off event followed by a turn-on event and another turn-off event. Therefore, all three of the on-state current and voltage $I_{on}$, $V_{on}$ and the off-state voltage $V_{off}$ may be measured during S6. The switching and conduction energies $E_{sw}$, $E_c$ may be determined as described above. Alternatively, the on-state voltage $V_{on}$ may be taken for example from interval S5. This may be advantageous in case the on-state duration within S5 after the second turn-on event in S5 is too short for the on-state voltage $V_{on}$ to settle.

In the seventh sample interval S7, the switching signal SS begins with an off-state and has a turn-on event followed by a turn-off event and another turn-on event. Therefore, all three of the on-state current and voltage $I_{on}$, $V_{on}$ and the off-state voltage $V_{off}$ may be measured during S7. The switching and conduction energies $E_{sw}$, $E_c$ may be determined as described above. Alternatively, the on-state voltage $V_{on}$ may be taken for example from interval S6. This may be advantageous in case the first on-state duration after the first turn-on event in S7 and the second on-state duration within S7 after the second turn on-event both are too short for the on-state voltage $V_{on}$ to settle.

In this way, the conduction and switching power loss $P_c$, $P_{sw}$ may be determined for each of the sample intervals S1, ..., S7 independently from the base clock of the power converter PC.

The conduction and switching power loss $P_c$, $P_{sw}$ may be added up by the evaluation unit EU to obtain a self-heating power loss Psh of the power semiconductor device PS1, which may be used as an input to a thermal model. The output of the thermal model may be used to determine the junction temperature of the power semiconductor device PS1.

Optionally, a cross-coupling power loss may be determined, for example by the evaluation unit EU, and be used as an additional input to the thermal model to improve accuracy. The cross-coupling power loss may result from further devices of the power converter PC, for example the further semiconductor devices PS2, . . . , PS6, and their effect on the junction temperature of the power semiconductor device PS1.

By means of a method or a circuit according to the improved concept of the present invention, an operating condition of a power converter, in particular a junction temperature of a power semiconductor device of the power converter, may be determined in a universal manner applicable to a great variety of power converters. This includes stand-alone solutions as well as power converters including a circuit according to the improved concept themselves. This is achieved by establishing a sample clock that is fixed and selected for the purposes of the operating condition analysis. Measurements are taken according to the pattern of switching within a sample interval defined by the sample clock period, so that both the power losses may be calculated correctly and the measurements may be taken appropriately.

The improved concept is compatible with any switching scheme of the power converter, including regular PWM, for example sine PWM, third harmonic injection, space-vector PWM, discontinuous PWM, for example over-modulation, multi-level converters, irregular PWM, for example direct torque control, hysteresis control, line-frequency switching, for example modular multi-level applications, high-speed motor drive operation or DC choppers, for example buck and boost DC-DC converters.

Furthermore, the improved concept is compatible with a wide range of switching frequencies of the power converter, for example hundreds of Hz to tens of kHz. Even as low frequencies as the modulation frequency in the range of 50-200 Hz are possible.

By means of the improved concept, also a common synchronization basis is provided for different hardware situated across an isolation barrier apart from the circuit according to the improved concept itself.

The improved concept may be further enhanced by determining the same operating parameter twice or more often during a given sample interval and calculating a respective average or other aggregate value for the power loss calculation. This may improve the accuracy in case of high frequency switching applications.

Implementations according to the improved concept may involve junction temperature estimation of a power semiconductor device, which may enable several features in next generation of "smart" power converters, including: dynamic rating control (intelligent over-rate/de-rate), optimized parallel inverter stack current sharing, condition monitoring (detection of wear-out and abnormal operation, giving predictive maintenance), temperature cycle counting and remaining useful life estimation, improved validation of inverter stack design during development and type testing, improved over-temperature detection.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS

PC power converter
DCU drive and control unit
PS1, . . . , PS6 power semiconductor devices
C circuit
EU evaluation nit
CG sample clock generator
MU measuring unit
S1, S2, S3, S4, sample intervals S5, S6, S7
SC sample clock signal
SS switching signal
$T_s$ sample interval duration
$t_{on}$ on-state duration
$I_{on}$ on-state current
$V_{on}$ on-state voltage
$V_{off}$ off-state voltage
$N_{on}$ number of turn-on events
$N_{off}$ number of turn-off events
$E_c$ conduction energy
$E_{sw}$ switching energy

The invention claimed is:

1. A method for analyzing an operating condition of a power converter, the method comprising:
   providing a sample clock signal;
   determining repeatedly at least one operating parameter of a power semiconductor device of the power converter,
      wherein the repetitions of determining the at least one operating parameter are synchronous to the sample clock signal, and
      wherein for a given repetition of the determination of the at least one operating parameter, determining the at least one operating parameter comprises measuring the at least one operating parameter or identifying a value for the at least one operating parameter from a previous repetition depending on a switching behavior of the power converter within the given repetition; and
   determining the operating condition of the power converter depending on the at least one determined operating parameter,
   wherein the sample clock signal is asynchronous to the operation of the power converter such that the sample clock signal is asynchronous to a base clock signal of the power converter.

2. The method according to claim 1, wherein determining the operating condition comprises:

determining at least one value for a power loss of the power semiconductor device depending on the at least one determined operating parameter; and determining the operating condition based on the at least one value for the power loss.

3. The method according to claim 2, wherein the at least one value for the power loss comprises a conduction power loss or a switching power loss.

4. The method according to claim 2, wherein the at least one value for the power loss is determined during or at the end of each of a plurality of consecutive sample intervals defined by a frequency of the sample clock signal.

5. The method according to claim 4, wherein the at least one operating parameter comprises at least one of:
- a total number of turn-on events within the respective sample interval;
- a total number of turn-off events within the respective sample interval; or
- a total on-state duration within the respective sample interval.

6. The method according to claim 1, wherein the at least one operating parameter comprises at least one of:
- an on-state condition of the power semiconductor device; or
- an off-state condition of the power semiconductor device.

7. The method according to claim 1,
wherein the power converter is configured to utilize a switching scheme for power conversion, and
wherein the sample clock signal being asynchronous to the operation of the power converter includes the sample clock signal being asynchronous to a characteristic signal, in particular a carrier signal, of the switching scheme.

8. The method according to claim 1, wherein the operating condition comprises a junction temperature of the power semiconductor device.

9. The method according to claim 8, wherein determining the junction temperature of the power semiconductor device comprises simulating the junction temperature using a thermal model of the power converter using, as an input, data depending on the at least one determined operating parameter.

10. The method according to claim 9, wherein the data comprises a self-heating power loss of the power semiconductor device.

11. The method according to claim 9, wherein the data comprises a cross-coupling power loss due to a further device of the power converter.

12. The method according to claim 1, wherein a period of the sample clock signal lies between 0.2 ms and 2 ms.

13. The method according to claim 1, wherein the sample clock signal comprises a clock signal that is asynchronous to an operation of the power converter.

14. The method according to claim 6,
wherein the on-state condition of the power semiconductor device comprises an on-state voltage or an on-state current of the power semiconductor device; and
wherein the off-state condition of the power semiconductor device comprises an off-state voltage of the power semiconductor device.

15. The method according to claim 12, wherein the period of the sample clock signal lies between 0.8 ms and 1.2 ms.

16. A circuit for analyzing an operating condition of a power converter, the circuit configured to:
provide a sample clock signal;
determine repeatedly at least one operating parameter of a power semiconductor device of the power converter, wherein:
the repetitions of the determining of the at least one operating parameter are synchronous to the sample clock signal, and
for a given repetition of the determining of the at least one operating parameter, determining the at least one operating parameter comprises measuring the at least one operating parameter or identifying a value for the at least one operating parameter from a previous repetition depending on a switching behavior of the power converter within the given repetition; and
determine the operating condition of the power converter based on the at least one determined operating parameter,
wherein the sample clock signal is asynchronous to the operation of the power converter such that the sample clock signal is asynchronous to a base clock signal of the power converter.

17. A method for analyzing an operating condition of a power converter, the method comprising:
providing a sample clock signal;
determining repeatedly at least one operating parameter of a power semiconductor device of the power converter,
wherein the repetitions of determining the at least one operating parameter are synchronous to the sample clock signal, and
wherein for a given repetition of the determination of the at least one operating parameter, determining the at least one operating parameter comprises measuring the at least one operating parameter or identifying a value for the at least one operating parameter from a previous repetition depending on a switching behavior of the power converter within the given repetition; and
determining the operating condition of the power converter depending on the at least one determined operating parameter,
wherein the operating condition comprises a junction temperature of the power semiconductor device, and
wherein determining the junction temperature of the power semiconductor device comprises simulating the junction temperature using a thermal model of the power converter based on a self-heating power loss of the power semiconductor device or a cross-coupling power loss due to a further device of the power converter.

* * * * *